United States Patent
Flach et al.

(10) Patent No.: US 7,414,421 B2
(45) Date of Patent: Aug. 19, 2008

(54) INSERTABLE CALIBRATION DEVICE

(75) Inventors: Björn Flach, Munich (DE); Andreas Logisch, Munich (DE); Monica De Castro Martins, Munich (DE); Wolfgang Ruf, Friedberg (DE); Martin Schnell, Munich (DE)

(73) Assignee: Infineon Technologies AG, Munich (DE)

( * ) Notice: Subject to any disclaimer, the term of this patent is extended or adjusted under 35 U.S.C. 154(b) by 29 days.

(21) Appl. No.: 11/290,138

(22) Filed: Nov. 30, 2005

(65) Prior Publication Data

US 2006/0149491 A1    Jul. 6, 2006

(30) Foreign Application Priority Data

Nov. 30, 2004   (DE)   .................. 10 2004 057 772

(51) Int. Cl.
*G01R 31/02* (2006.01)
(52) U.S. Cl. .................................... 324/763
(58) Field of Classification Search ........... None
See application file for complete search history.

(56) References Cited

U.S. PATENT DOCUMENTS

| | | | | |
|---|---|---|---|---|
| 4,724,378 A | * | 2/1988 | Murray et al. ............ | 714/738 |
| 6,060,898 A | * | 5/2000 | Arkin .................... | 324/765 |
| 6,417,682 B1 | | 7/2002 | Suzuki et al. | |
| 6,724,181 B2 | | 4/2004 | Schittenhelm | |
| 6,819,117 B2 | * | 11/2004 | Wilsher ................. | 324/601 |
| 6,820,234 B2 | | 11/2004 | Deas et al. | |
| 6,826,720 B2 | * | 11/2004 | Suzuki et al. ............ | 714/720 |
| 6,897,646 B2 | | 5/2005 | Grebner et al. | |
| 6,956,365 B2 | * | 10/2005 | Niv et al. ............... | 324/158.1 |
| 2004/0201375 A1 | * | 10/2004 | Niv et al. ............... | 324/158.1 |

FOREIGN PATENT DOCUMENTS

| | | |
|---|---|---|
| DE | 19922907 A1 | 12/1999 |
| DE | 10056882 A1 | 6/2002 |
| DE | 10141025 A1 | 3/2003 |
| DE | 69905750 T2 | 3/2003 |

* cited by examiner

*Primary Examiner*—Jermele M Hollington
(74) *Attorney, Agent, or Firm*—Maginot, Moore & Beck

(57) ABSTRACT

An insertable calibration device for a programmable tester apparatus comprises at least one calibration unit and a control unit. The progammable tester apparatus is configured to test at least one electronic device with electronic circuits. The progammable tester apparatus comprises a holding device, contact-making devices for the electronic device, and tester channels for coupling in signals to the electronic device. The calibration unit is connected to a first tester channel to be calibrated. The calibration unit is configured to detect a calibration signal edge of a calibration signal that is transmitted by the tester apparatus at a certain transmission instant, to detect a reference signal edge of a reference signal that is transmitted by the tester apparatus via a second tester channel at a reference instant, to compare the instants at which the two signal edges arrive, and to output a comparison result. The control unit evaluates the comparison results and can be used to program the transmission instants in such a way that the instants at which the calibration signal edge and the reference signal edge arrive, for the compensation of signal propagation time differences, are substantially identical. The calibration device has the same form and connections as the electric device and is insertable into the holding device with an accurate fit instead of the electronic device.

19 Claims, 4 Drawing Sheets

INSERTABLE CALIBRATION DEVICE

BACKGROUND OF THE INVENTION

1. Field of the Invention

The invention relates to a calibration device for a programmable tester apparatus that can be inserted into a holding.

2. Description of the Related Art

Electronic circuits, which are used for example for integrated circuits in chips or electronic components, have to be tested before being shipped to the customer. This is done using tester devices which couple in predefined signal sequences to the circuits under test, or the device under test having the electronic circuits, and register and evaluate the corresponding reaction of the devices under test.

In the case of memory testers, which for example test memory chips with regard to their functionality, essentially rising and falling signal edges with a specific temporal succession are passed to a memory chip under test and corresponding signals are coupled out from the memory chip and analysed. A tester arrangement of this type is generally provided with a number of bidirectional tester channels that are led via corresponding adapter sockets to the device under test, here the corresponding memory chip. A tester channel is understood hereinafter to be the means by which test signals are passed to the device and, in the case of bidirectional embodiment, signals also pass from the device to the tester.

In order to be able to test modern, fast memory chips, in particular, synchronization of the many different tester channels by means of which signal edges are coupled into the device under test is very important. In order to test memory accesses, by way of example, rising and falling signal edges have to be applied simultaneously to a specific number of data connections of a memory chip under test. In order that the respective test signal edges arrive simultaneously at the device under test, it is necessary, in the context of test signal or test signal edge generation, to take account of the signal propagation times through cable connections, test sockets, propagation times through to the connecting elements to the connection pins of the device under test in the definition, at the tester end, of the instants at which respective signal edges are generated.

FIG. 4 shows by way of example, an arrangement for testing electronic devices. In this case, a programmable tester device is provided, having a tester mainframe TMF, for generating test signals that are passed via tester channels TKN and holding and contact-making means TK, HFM, DSA, S to a device under test DUT.

In this case, in generally known tester arrangements, the device under test DUT is inserted into a socket S, which is in turn mounted on a device socket adapter DSA. The connection between the actual test head TK, having the driver electronics and comparators for the individual tester channels TKN, and the device socket adapter DSA is effected by a so-called HiFix HFM, which keeps a cabling K ready. In order to take account as far as possible of the entire signal path between the tester mainframe TMF with the test head TK and the device under test DUT in the calibration of the tester channels TKN, various solutions have been proposed in the past.

In a procedure according to the so-called autocalibration AutoCal, a calibration unit (not illustrated here) with drivers and comparators for each tester channel is placed on to the test head TK. It is then possible, through comparison of the arriving signals at a calibration unit of this type, to determine at least the signal propagation time difference between tester channels TKN in the test head TK itself and to compensate for these differences through programming of the tester mainframe. In a procedure according to AutoCal it is not possible, however, to take account of influences through the cabling K in the HiFix HFM, which is required in the actual memory test. A further disadvantage is that docking the calibration unit to the test head TK is time-consuming and thus delays a subsequent tester run. Furthermore, AutoCal affords only low accuracy for the calibration.

In a calibration according to SBCal the device socket adapters DSA have to be replaced by manufactured calibration socket adapters CSA which short-circuit groups of tester channels TKN or cables K of the HiFix with one another. It is thus possible, through suitable programming PRG of the tester mainframe TMF, to detect the signal propagation time by transmitting signal edges into the HiFix HFM and detecting the corresponding signal on the assigned short-circuited tester channel, a propagation time through to the device socket adapter and to compensate for it through suitable programming.

Although SBCal achieves calibration through to the HiFix plane, the calibration outlay as a result of the removal of the device socket adapters and the devices under test is high. Moreover, influences on the signal propagation time within the sockets S and the device socket adapter DSA cannot be taken into account here.

In the case of so-called HiCal, the sockets S are removed from the device socket adapters DSA and the corresponding contacts between device socket adapter DSA and socket S are tapped by means of a robot. This external robot thus measures signals such as would be coupled into the socket S during a test method. By means of the external evaluation in a robot, the tester mainframe TMF can again be manually programmed in such a way that signals coupled into the tester channels TKN arrive simultaneously at least at the device socket adapter DSA. However, the influences of the sockets S on the signal propagation times are left out of consideration in the case of HiCal as well.

The already known possibilities for calibrating the tester channels thus have a series of disadvantages. In comparison with carrying out the test method on the device under test, it is necessary for the signal paths to be altered during the calibration. Additional tester hardware is required for the known calibration methods. Compared with an actual test cycle of the devices, it is necessary to alter the set-up for the calibration, which is time-consuming.

SUMMARY OF THE INVENTION

It is an object of the present invention to provide an insertable calibration apparatus for a programmable tester device which, during the calibration, utilizes the same signal paths as during a test method for devices having electronic circuits in a respective production environment. The apparatus can preferably be inserted without modifications at a tester arrangement and is intended to afford a high calibration accuracy.

The object of the invention is achieved by means of an insertable calibration apparatus for a programmable tester device for testing at least one device having electronic circuits, the tester device having a holding apparatus and contact-making means for the device under test and having tester channels for coupling in signals to the device under test. The insertable calibration apparatus according to the invention has:

at least one calibration unit connected to a tester channel to be calibrated for detecting a calibration signal edge of a calibration signal that is transmitted by the tester device at a transmission instant and a reference signal edge of a reference signal that is transmitted by the tester device via a further tester channel at a reference instant, for comparing the instants at which the two signal edges arrive, and for outputting a comparison result;

a control unit for evaluating the comparison results and for programming the respective transmission instant in such a way that the instants at which the calibration signal edge and the reference signal edge arrive, for the compensation of signal propagation time differences, are substantially identical.

In this case, the calibration apparatus has the same form and connections as the device under test and is insertable into the holding apparatus with an accurate fit instead of the device under test.

One idea underlying the invention consists in enabling the measurement or detection of signals for calibrating the tester channels directly at the holding apparatus and the contact-making means of the device under test. The insertable calibration apparatus according to the invention is configured for this purpose such that it has practically the same form as the respective component under test or device under test. As a result, the calibration apparatus can be inserted as it were as a dummy device, for example into the sockets of the tester. As a result, the entire signal path from the test head to the device under test having electronic circuits is taken into account in the calibration and an extremely high accuracy is thus achieved. A further inventive idea consists in utilizing one of the tester channels as a reference channel by means of which a reference signal having reference signal edges is passed to the calibration apparatus and a synchronization of the arriving calibration signal edges with the reference signal edge is achieved through the feedback programming of the tester device by means of the control unit.

The calibration apparatus is preferably designed as an integrated circuit.

The calibration apparatus is advantageously embodied in the same type of housing as the corresponding device under test. Furthermore the calibration apparatus preferably has the same connection allocation as the device under test. It is thus possible to effect a particularly simple and fast calibration before carrying out the actual test method, without additional modification measures at the entire test arrangement.

In an alternative embodiment, the calibration apparatus and the device under test are formed on a semiconductor wafer, the respective semiconductor wafer having electronic circuits. Since the calibration apparatus according to the invention is in each case modelled on the device under test, this embodiment also enables calibration of tester devices provided for use for testing entire semiconductor wafers. In this case, the device under test may preferably have semiconductor memories, such as e.g. DRAMS, SRAMS or ROMS; the tester device is a customary memory tester.

In a restricted version of the inventive apparatus, the number of calibration units corresponds to the number of tester channels. This enables all the tester channels to be calibrated simultaneously. The calibration units are then preferably connected to the control unit via a data and control bus.

A trigger logic maybe provided for the distribution of the reference signal edges to the calibration units. It is then particularly advantageous if each calibration unit has a trigger switching unit for switching through the reference signal possibly present on the respective tester channel to the trigger logic.

The trigger logic may furthermore be coupled via a trigger bus to the calibration units for rapid signal exchange. This additional high-speed bus enables the corresponding signals to be distributed with a particularly short propagation time.

Each calibration unit may have a phase detector for comparing the respective calibration signal edge with the reference signal edge, the phase detector in each case outputting a comparison signal for indicating which of the two edges arrives first.

Preferably, each calibration unit may have a delay path for delaying the calibration signal edge by a delay time. The delay time then advantageously corresponds to the signal propagation time of the reference signal through the trigger logic and to the respective calibration unit. What is thereby achieved is that the reference signal edge is compared with the respective calibration signal edge by the phase detector simultaneously at all the calibration units. A corruption of the comparison result by propagation times within the calibration apparatus is thus prevented.

In another restricted version of the inventive calibration apparatus, a counter device is provided in the calibration unit, for counting comparison results in the case of which the respective calibration signal edge arrives at the phase detector before or after the reference signal edge. As a result, it is possible to conduct calibration signal edges at very high frequency to the calibration apparatus and, by means of the counting of events in the case of which the reference signal edge arrives before the calibration signal edge and counting of the events in the case of which the calibration signal edge arrives before the reference signal edge, a statistical evaluation is possible, and the control unit can perform a programming of the transmission instants of signal edges for their synchronization or for simultaneous arrival of the calibration apparatus. For this purpose, the calibration apparatus advantageously has an interface for connection to a programming interface of the tester device.

At least one of the tester channels maybe embodied in bidirectional fashion and is used for programming the tester device. This has the advantage that no further cabling becomes necessary between the calibration apparatus that is insertable according to the invention and the tester mainframe.

In a further restricted version of the inventive calibration apparatus, the calibration units furthermore have driver units for generating tester calibration signals having tester calibration signal edges, the driver units in each case coupling a driver signal edge into the respective tester channel in a manner triggered by a reference signal edge simultaneously. Such driver units, according to the invention enable the calibration of the comparators and drivers in a tester head or a tester mainframe, or the calibration for signals passed to the tester.

DESCRIPTION OF THE DRAWINGS

In the Figures, unless specified otherwise, functionally identical elements are provided with identical reference numerals.

FIG. 1 illustrates a calibration apparatus 1 according to the invention for insertion in a tester system 2.

Figure 1:
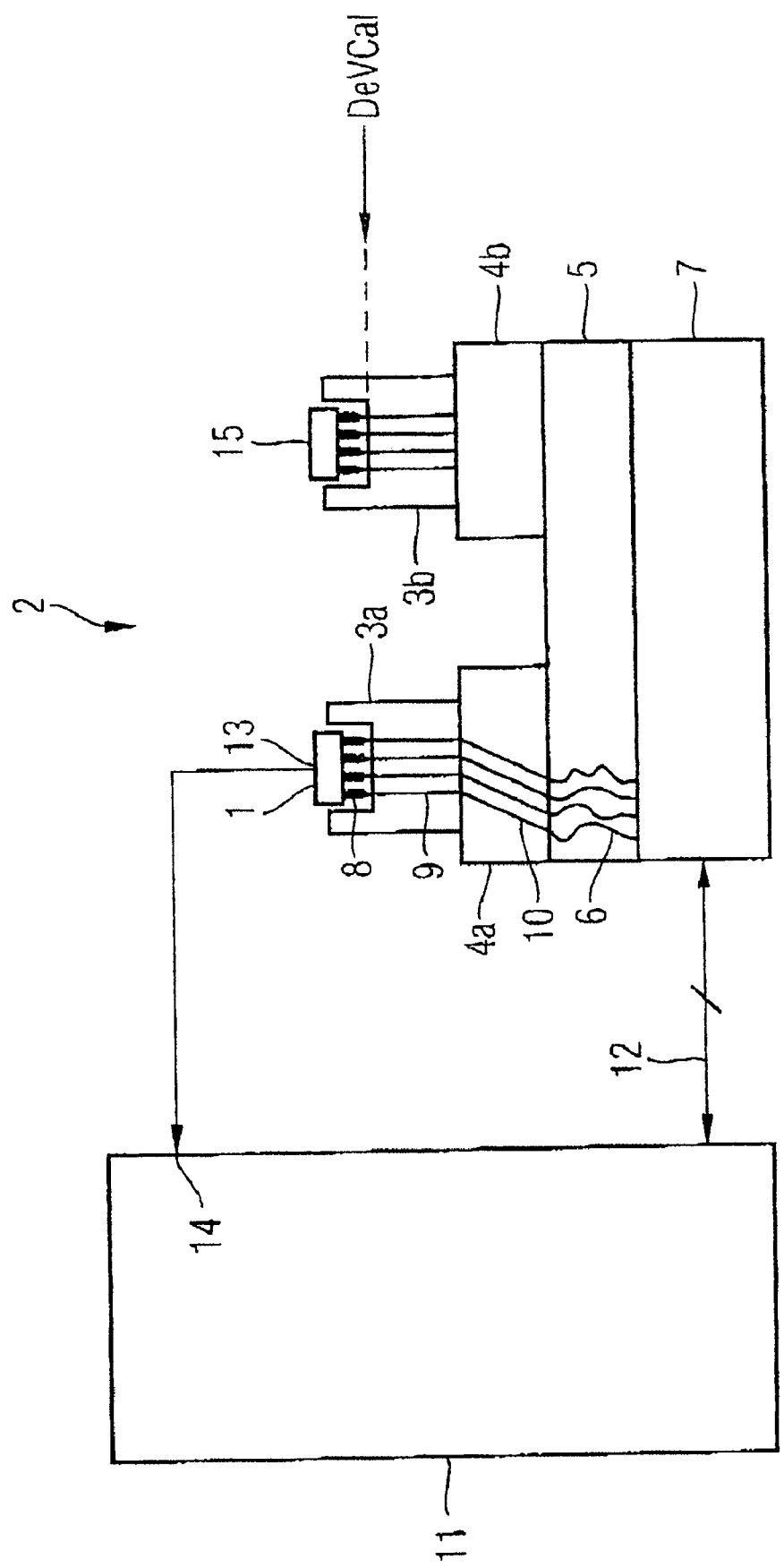
FIG. 1 is a tester arrangement with insertion of the calibration apparatus according to the invention.

In this case, the insertable calibration apparatus 1 is inserted into a test socket 3, which is plugged on to a device socket adapter 4a, 4b, which in turn rests on the HiFix 5, which produces the connection to the test head 7 via cables 6.

The electrical connection between the connection pins 8 of the calibration apparatus 1 according to the invention and the test head 7 is best effected by electrical connectors 9 in the test socket 3, a wiring 10 in the device socket adapter 4 and the cabling 6 of the HiFix 5. Programmed signals or signal edges are generated in the test head 7 and pass via the HiFix 5, the device socket adapters 4 and the test sockets 3 to the calibration apparatus 1. In this case, the tester channels are determined by the tester mainframe 11, which is embodied in programmable fashion, or the signals 12 to be transmitted and, in particular, the instants for their signal edges are program-controlled.

In the exemplary embodiment shown here, the calibration apparatus is provided with an interface 13 via which the calibration apparatus 1 is connected to a programming interface 14 of the tester device.

The test system illustrated in FIG. 1 illustrates two device socket adapters 4a, 4b and test sockets 3a, 3b, of which, by way of example, a device under test having electronic circuits 15 is illustrated in the test socket 3b.

The arrow DeVCal indicates the wiring plane in which the calibration according to the invention is effected by the calibration apparatus 1. The embodiment of the calibration apparatus practically as a dummy of the device 15 under test enables particularly simple handling during the production of the devices having electronic circuits. Before the actual test of the devices takes place, the calibration apparatus can be inserted and a calibration of the tester device can be carried out.

Figure 2:
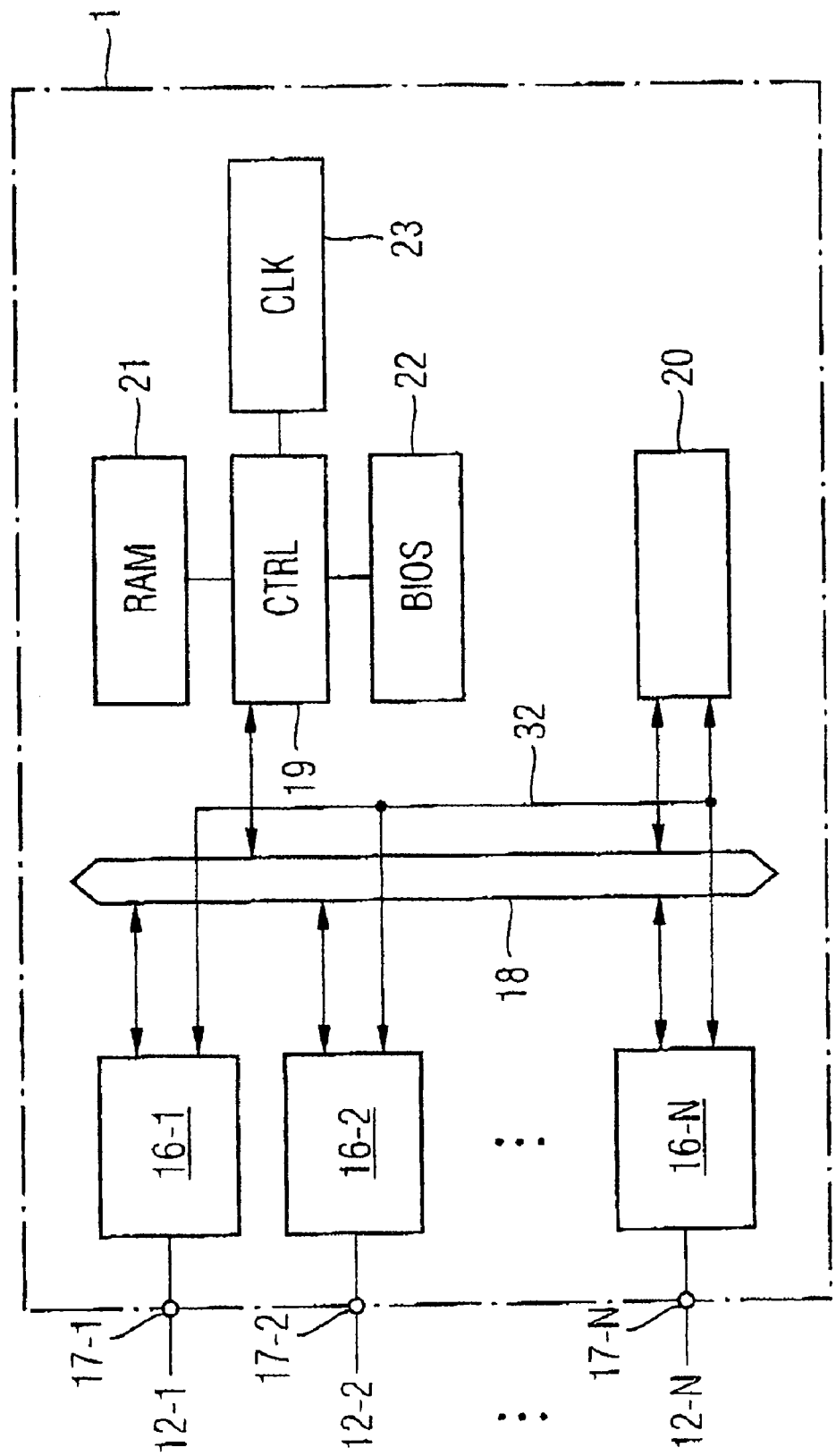
FIG. 2 is a block diagram of the calibration apparatus according to the invention.

FIG. 2 shows a block diagram of the calibration apparatus 1 according to the invention.

The calibration apparatus 1 is provided with connections 17-1, 17-2, . . . 17-N for coupling to the or of the tester channels 12-1, 12-2, . . . 12-N. Via the connections 17-1, . . . 17-N, calibration units 16-1, 16-2, . . . 16-N are respectively connected to the tester channels 12-1, . . . 12-N. The calibration units 12-1, . . . 12-N communicate with a control unit 19 and a trigger logic 18 via a data and control bus 18. The trigger logic 20 is coupled to the calibration units 16-1, . . . 16-N via a trigger bus 32.

The control unit 19 is coupled via lines to an internal memory 21 of the calibration apparatus 1, to an internal clock generator 23 and to a non-volatile memory 22 having a basic operating system for carrying out calibration methods. By way of example, various calibration programs may be stored in the internal memory 21.

The calibration, for example of one of the tester channels 12 is effected first of all by selecting one of the tester channels 12 as a reference channel via which reference signals having reference signal edges are coupled into the calibration apparatus 1. The coordination between the calibration apparatus 1 and the tester device 11 may be effected for example in program-controlled fashion, as illustrated in FIG. 1 via a programming interface 13, 14, or else alternatively also by utilizing one or a plurality of the tester channels 12 via the data and control bus 18 as communication and control channel.

As soon as a tester channel 12 has been determined as reference channel, the tester transmits a rising signal edge on all the tester channels 12-1, . . . 12-N and the selected reference channel.

The calibration unit 16 connected to the reference channel switches the reference signal or the reference signal edge through to the trigger logic 20 via the trigger bus 32. The trigger logic 20 forwards the corresponding reference signal edge up to the rest of the calibration units 16 again via the trigger bus 32 in a manner controlled via the data and control bus 18.

The respective calibration unit 16 compares with one another the instants at which the reference signal edge and the corresponding signal edge or calibration signal edge coupled in by the respective tester channel and forwards a comparison result to the control unit 19 via the data and control bus 18. The trigger bus 32 is designed as a high-speed bus and distributes the signal edges present bidirectionally to and from the calibration units 16-1, . . . 16-N without a significant delay.

The control unit 19 can then reprogram the tester device 11 in accordance with the respective time offset offset between reference signal edge and calibration signal edge until all the reference signal edges and calibration signal edges arrive synchronously at the respective calibration units 16.

The signal propagation time within the calibration apparatus 1, for example for the distribution of the reference signal received by one calibration unit 16 to the rest of the calibration units 16-1 . . . 16-N by the trigger logic 20 and the trigger bus 32 is taken into account in the calibration units 16, as is explained in the following FIG. 3.

Figure 3:
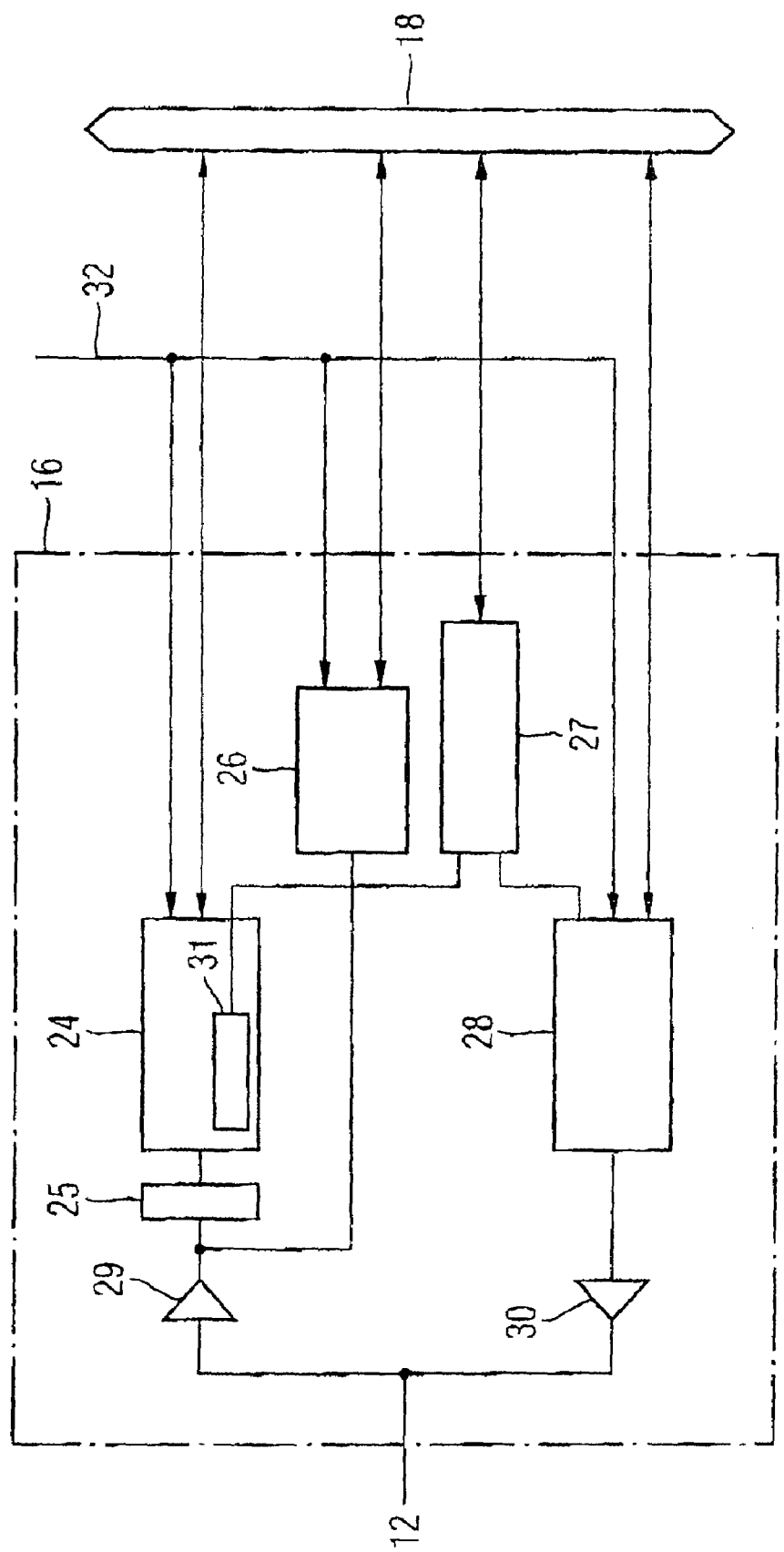
FIG. 3 is a block diagram of a calibration unit according to the invention.
Figure 4:
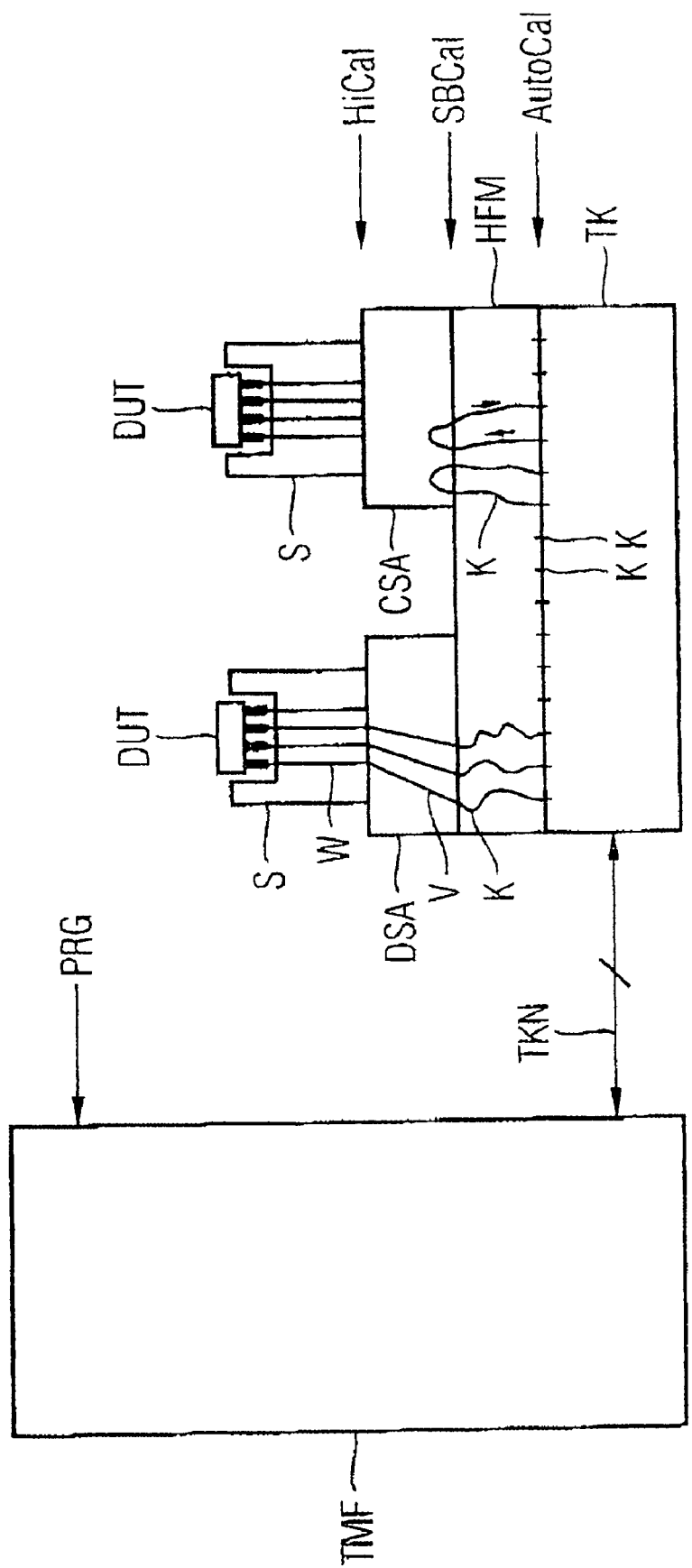
FIG. 4 as described above, is a test arrangement according to the prior art.

FIG. 3 shows a calibration unit 16 according to the invention.

A tester channel 12 is coupled to the calibration unit 16. The calibration unit 16 is furthermore coupled via lines to the data and control bus 18 and to the trigger bus 32. The calibration unit 16 has an input amplifier 29 for amplifying the signals coupled in by the tester channel 12. The amplified coupled-in signal is fed to a phase detector 24 via a delay path 25.

The phase detector 24 furthermore receives, via the trigger bus 32, the reference signal that is coupled into the calibration apparatus via a further calibration unit. In order that each tester channel can be used as reference channel, a trigger switching unit 26 is provided, to which the amplified signal coupled in by the tester channel 12 is likewise fed and which is connected to the trigger bus 32. The trigger switching unit 26 is controlled by the trigger logic 20 (as illustrated in FIG. 2) via the data and control bus 18. The trigger switching unit 26 serves, if the calibration unit has been selected as the one whose input signal is used as reference signal, for switching the respective reference signal through to the rest of the calibration units via the fast trigger bus 32 and the trigger logic 20.

The phase detector 24 has a counter device 31, which counts comparison results generated by the phase detector, in such a way that those events in the case of which the reference signal edge arrives at the phase detector 24 before the calibration signal edge are counted and those events in the case of which the reference signal edge arrives after the calibration signal edge are likewise counted. These counting results or the comparison results are fed to a communication unit 27.

The communication unit 27 is likewise coupled to the data and control bus 18 and communicates the corresponding counting or comparison results to the control unit 19.

The calibration unit 16 according to the invention additionally has a driver unit 28, which is coupled to the respective tester channel 12 via an output amplifier 30. The driver unit 28 is furthermore connected to the communication unit 27 and coupled to the data and control bus 18 and also to the trigger bus 32. The calibration unit 16 is therefore prepared in such a way that it can both receive the reference signal and forward it to the trigger bus 32 and can receive calibration signals and compares the latter with the reference signal distributed via the trigger bus 32 and the trigger logic 20 and outputs a comparison result. The coordination of the all these calibration sequences is effected by the control unit 19, which, if appropriate, can also receive lists or programs for the calibration sequence from the tester mainframe 11 via one of the tester channels, or itself programs the tester device 2. By means of this programming by the control unit 19, the transmission instants for the calibration signal edges are set or programmed in such a way that all the signal edges arrive at the calibration units 16 at the same instant.

An exemplary calibration will be briefly explained below, reference being made to FIGS. 1, 2 and 3.

Firstly, one of the tester channels 12 is selected as reference channel. The tester device 11, 7 emits a rising edge to all the tester channels. In this case, the signal via the reference channel is regarded as a reference signal edge, and the remaining signals are regarded as calibration signal edges. The calibration unit 16 connected to the tester channel used as reference channel conducts, in a manner controlled by the trigger switching unit 26, which is driven by control signals of the control unit 19 via the data and control bus 18, the reference signal edge in turn via the trigger bus 32 to the trigger logic 20. The trigger logic 20 switches the reference signal edge to all the rest of the calibration units 16 via the trigger bus 32.

In the calibration units, the reference signals are in each case fed to the corresponding phase detectors 24. The calibration units 16 receive the calibration signals, which are amplified in the respective input amplifiers 29, and are delayed by a delay time in the delay paths 25. In this case, the delay times are set in such a way that the delay time in each case corresponds to the signal propagation time of the reference signal through the trigger logic 20 and the corresponding signal path on the trigger bus 32. Consequently, the propagation time of the reference signal edge within the calibration apparatus 1 is compensated for and a particularly good calibration accuracy is achieved. The setting of the propagation time by the delay path 25 may be achieved, for example by the delay path having a simulation of the signal path of the trigger logic with all line lengths and gates.

The respective calibration signal edge delayed in this way is fed to the respective phase detector 24, which carries out a comparison with the respective reference signal edge and feeds the comparison result to an internal counter device 31. If, by way of example, the calibration signal edge arrives at the phase detector 24 before the reference signal edge, the phase detector outputs a 1 to the counter device, and if it arrives later said phase detector outputs a 0. During the calibration, this operation of transmitting calibration signal edges and reference signal edges is repeated multiply, for example 100 times. This leads to counter readings in the counter device 31 for the respective events in the case of which the calibration signal edge arrives before the reference signal edge and a counter reading for the events in the case of which the calibration signal edge arrives after the reference signal edge.

On the basis of these counter readings, for example 56 earlier results and 54 later results, the control unit 19, which receives the counter readings via the communication unit 27 and the data and control bus 18, can adapt or calibrate or program the transmission instants in the tester device until the instants at which the calibration signal edge and the reference signal edge arrive are essentially identical.

The calibration according to the invention with the calibration apparatus 1 that is insertable according to the invention enables all the tester channels to be calibrated simultaneously and primarily in the same configuration of the tester arrangement as during the actual test of the component under test. There is no need for modifications to the test apparatus, nor is account taken of only parts of the entire signal path between tester head 7 and the component under test or device under test 15. As a result, the calibration accuracy is considerably improved compared with measures according to the prior art.

The calibration apparatus 1 according to the invention furthermore enables the calibration of the tester comparators in the test head 7. Comparators for detecting component-related signals are in each case present for each tester channel. For this purpose, one of the tester channels is again used as reference channel. The tester device 11, 7 transmits a reference signal edge to the calibration apparatus 1 according to the invention. This reference signal edge is used as a trigger signal to start the simultaneous outputting of tester calibration signal edges by the calibration units 16.

During the calibration of the tester comparators, the tester calibration signal edges are generated by the driver unit 28, amplified by the transmission amplifier 30 and coupled into the corresponding tester channel. The calibration-apparatus-related transmission instant of the tester calibration signals is communicated to the driver unit 28 by the trigger logic 20 via the trigger bus 32 and the transmission of the respective tester calibration signal is started. Possible internal signal propagation times in the calibration apparatus 1, for example of the trigger signal which is transmitted to the driver unit 28 by the trigger logic 20, can then be concomitantly taken into account in the assessment of the input instants at the test head 7.

The tester device 11 evaluates the received tester calibration signal edges whilst taking account of known possible propagation times of the trigger signal within the calibration apparatus and adapts internal delay paths in the test head 7 in such a way that the calibration signal edges transmitted by the calibration apparatus 1 are detected simultaneously by the tester comparators. Consequently, the invention also achieves a calibration of the signal paths between the calibration apparatus 1 or a device 15 under test and the test head 7 in the direction of the tester apparatus.

Although the present invention has been explained on the basis of exemplary embodiments, it is not restricted thereto but rather can be modified in diverse ways without departing from the basic idea of the invention.

Although the device under test has also been referred to a component under test in the examples, this need not be housed embodiment of the component under test. Rather, it is also conceivable to simulate entire semiconductor wafers in the form of a calibration apparatus and to form the corresponding elements of the calibration apparatus such as, for example the calibration unit and the control unit on the corresponding wafer itself. A calibration apparatus embodied in this way would then easily be fed by the wafer handler to the tester system instead of a semiconductor wafer under test. Therefore, it is particularly advantageous that the calibration apparatus according to the invention has the same form and connection possibilities as the device under test which is used in the test.

The calibration apparatus that is insertable according to the invention can be used in diverse ways, but a high calibration accuracy is necessary for memory test apparatuses, in particular, so that an embodiment of the calibration apparatus then particularly expediently has the form and connection allocation of corresponding memory products.

Although modifications and changes may be suggested by those skilled in the art, it is the intention of the inventors to embody within the patent warranted heron all changes and modifications as reasonably and properly come within the scope of their contribution to the art.

We claim as our invention:

1. An insertable calibration device for a programmable tester apparatus; said programmable tester apparatus being configured to test at least one electronic device with electronic circuits, comprising a holding device, comprising contact-making devices for said electronic device, and comprising tester channels for coupling in signals to said electronic device; said calibration device comprising:

at least one calibration unit which is connected to a first tester channel of said tester channels to be calibrated; said at least one calibration unit being configured to detect a calibration signal edge of a calibration signal that is transmitted by said tester apparatus at a certain transmission instant, said at least one calibration unit being configured to detect a reference signal edge of a reference signal that is transmitted by said tester apparatus via a second tester channel of said tester channels at a reference instant, said at least one calibration unit being configured to compare the instants at which said two signal edges arrive, and said at least one calibration unit being configured to output a comparison result; and a control unit for evaluating said comparison results and for programming said transmission instants in such a way that said instants at which said calibration signal edge and said reference signal edge arrive, for the compensation of signal propagation time differences, are substantially identical;

said calibration device, including said at least one calibration unit and said control unit, having the same form and connections as said electronic device and being insertable into said holding device with an accurate fit instead of said electronic device.

2. The device of claim 1, wherein said calibration device has a geometry such that it can be inserted into a tester socket for receiving said device under test.

3. The device of claim 1, wherein said calibration device is designed as an integrated circuit.

4. The device of claim 1, wherein said calibration device and the electronic device are formed on a semiconductor wafer, the respective semiconductor wafer having electronic circuits.

5. The device of claim 1, wherein said calibration device has a housing of an identical type of housing as an housing of said electronic device.

6. The device of claim 1, wherein said electronic device has a connection allocation, said calibration device having the same connection allocation as said electronic device.

7. The device of claim 1, wherein said electronic device comprises semiconductor memories.

8. The device of claim 1, wherein the number of said calibration units corresponds to the number of said tester channels.

9. The device of claim 1, wherein said calibration units are connected to said control unit via a data and control bus.

10. The device of claim 1, comprising a trigger logic for the distribution of said reference signal edge to the calibration units.

11. The device of claim 10, wherein each of said calibration units has a trigger switching unit for switching through said reference signal present on the respective of said tester channels to said trigger logic.

12. The device of claim 10, wherein said trigger logic is coupled via a trigger bus to said calibration units for rapid signal exchange.

13. The device of claim 1, wherein each calibration of said units comprises a phase detector for comparing said respective calibration signal edge with said reference signal edge, said phase detector in each case outputting a comparison signal for indicating which of the two edges arrives first.

14. The device of claim 1, wherein each of said calibration units comprises a delay path for delaying said calibration signal edge by a delay time.

15. The device of claim 14, wherein said delay time corresponds to said signal propagation time of said reference signal through said trigger logic and to the respective calibration unit.

16. The device of claim 12, wherein comprising a counter device in said calibration unit, for counting comparison results indicating whether said respective calibration signal edge arrives at said phase detector before or after said reference signal edge.

17. The device of claim 1, comprising said an interface for connection to a programming interface of said tester apparatus.

18. The device of claim 1, wherein least one of said tester channels is embodied in bidirectional fashion and is used for programming said tester device.

19. The device of claim 1, wherein said calibration units comprise have driver units for generating tester calibration signals having tester calibration signal edges, said driver units in each case coupling a driver signal edge into the respective of said tester channels in a manner triggered by said reference signal edge simultaneously.

* * * * *